(12) United States Patent
Liu et al.

(10) Patent No.: US 8,003,303 B2
(45) Date of Patent: Aug. 23, 2011

(54) INTENSITY SELECTIVE EXPOSURE METHOD AND APPARATUS

(75) Inventors: George Liu, Shin-chu (TW); Kuei Shun Chen, Hsin-Chu (TW); Chih-Yang Yeh, Jhubei (TW); Te-Chih Huang, Chu-Bei (TW)

(73) Assignee: Taiwan Semiconductor Manufacturing Company, Ltd, Hsin-Chu (TW)

( * ) Notice: Subject to any disclaimer, the term of this patent is extended or adjusted under 35 U.S.C. 154(b) by 176 days.

(21) Appl. No.: 12/421,378

(22) Filed: Apr. 9, 2009

(65) Prior Publication Data
US 2010/0261118 A1   Oct. 14, 2010

(51) Int. Cl.
  *G03F 7/00* (2006.01)
  *G03F 1/00* (2006.01)
(52) U.S. Cl. .......................... 430/312; 430/5

(58) Field of Classification Search ........ 430/5, 311–313
See application file for complete search history.

(56) References Cited

U.S. PATENT DOCUMENTS

| 5,821,013 | A * | 10/1998 | Miller et al. | 430/5 |
| 6,093,507 | A * | 7/2000 | Tzu | 430/5 |
| 2009/0101906 | A1* | 4/2009 | Hosoya et al. | 257/59 |

* cited by examiner

*Primary Examiner* — Mark F Huff
*Assistant Examiner* — Stewart A Fraser
(74) *Attorney, Agent, or Firm* — Haynes and Boone, LLP

(57) ABSTRACT

A gradated photomask is provided. The photomask includes a first region including a first plurality of sub-resolution features and a second region including a second plurality of sub-resolution features. The first region blocks a first percentage of the incident radiation. The second region blocks a second percentage of the incident radiation. The first and second percentage are different. An intensity selective exposure method is also provided.

18 Claims, 6 Drawing Sheets

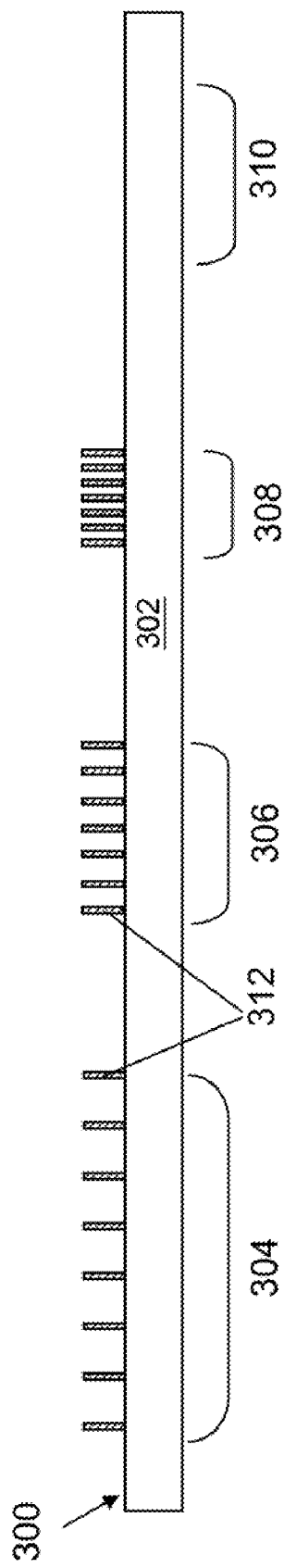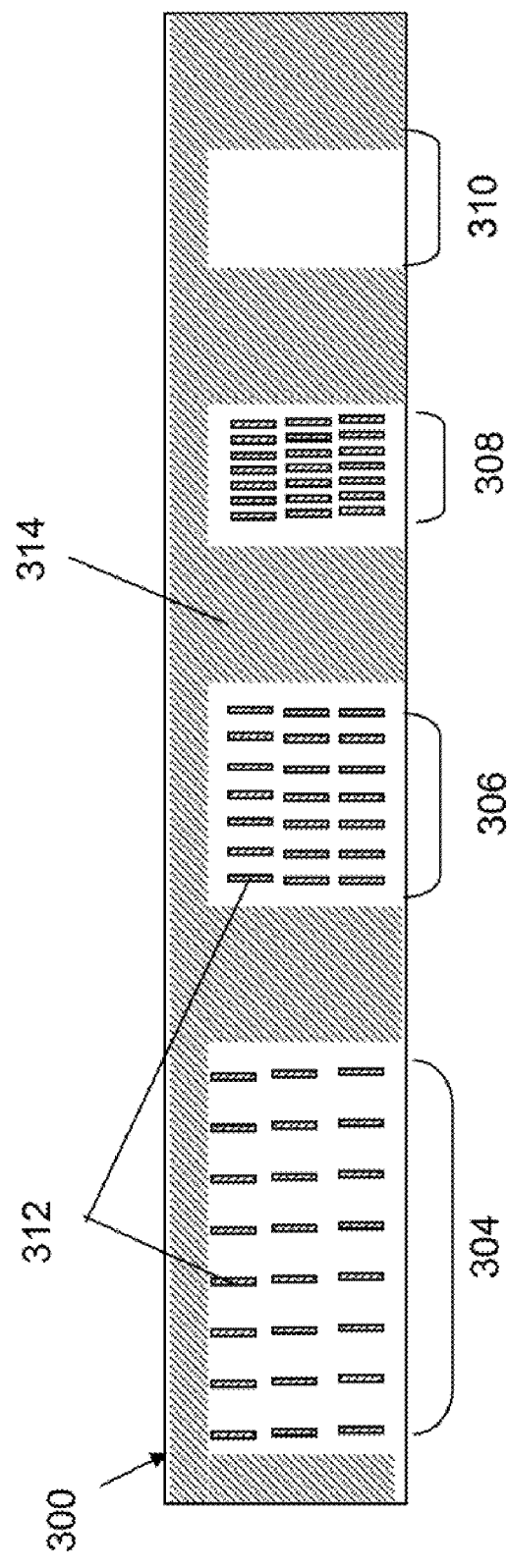

INTENSITY SELECTIVE EXPOSURE METHOD AND APPARATUS

BACKGROUND

The features used to create integrated circuits (ICs) are continually decreasing in feature size and spacing and/or increasing in density. Challenges arise however as topography varies across the substrate. For example, one region of a substrate may include a dense array of features while nearby area has an isolated feature. This topography can cause overlying layers to be deposited with non-uniform thickness, which may impact further processing. Therefore, what is needed is formation of a uniform layer on a semiconductor substrate overlying varying topography.

SUMMARY OF INVENTION

In an embodiment, a gradated photomask is provided. The photomask includes a first region including a first plurality of sub-resolution features and a second region including a second plurality of sub-resolution features. The first region blocks a first percentage of the incident radiation and the second region blocks a second percentage of the incident radiation. The first and second percentage are different. In an embodiment, the sub-resolution features are chrome. In an embodiment, the first plurality of sub-resolution features have a pattern density that is greater than the pattern density of the second plurality of sub-resolution features. In an embodiment, the photomask does not include a pattern defining a main feature of a semiconductor device.

In another embodiment, a method is provided. The method includes providing a semiconductor substrate. A photosensitive material is deposited on the semiconductor substrate. A first thickness of photosensitive material is formed at a first section of the substrate and a second thickness of photosensitive material is formed at a second section of the substrate. The first and second thicknesses are different. A photomask is provided that has a first region and a second region, each including a plurality of sub-resolution features. The photosensitive material is exposed by passing radiation through the photomask. The radiation passing through the first region of the photomask is incident the first section of the substrate and radiation passing through the second region of the photomask is incident the second section of the substrate. The exposed photosensitive material is developed. A third thickness of photosensitive material is developed in the first section and a fourth thickness of photosensitive material is developed in the second section. The third and fourth thicknesses are different.

In yet another embodiment, a method is also provided. The method includes providing a semiconductor substrate and forming a plurality of features on the semiconductor substrate. The plurality of features provide a first substrate region having a first topography and a second substrate region having a second topography. A photosensitive layer is deposited on the substrate overlying the plurality of features. An intensity selective exposure of the photosensitive layer is performed. The intensity selective exposure includes providing a radiation beam and passing the radiation beam through a first region of a photomask and a second region of the photomask. The first region allows a first energy level of the radiation beam to traverse the photomask and the second region allows a second energy level of the radiation beam to traverse the photomask. The first and second energy level of radiation are different. The intensity selective exposure further includes exposing the photosensitive layer overlying the first substrate region to the first energy level of radiation, and exposing the photosensitive layer overlying the second substrate region to the second energy level.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

FIGS. 3a and 3b are cross-sectional and top views, respectively, illustrating an embodiment of a photomask.

FIG. 5 is a cross-sectional view illustrating an embodiment of the substrate of FIG. 4b after exposure using the photomask for FIG. 4a.

DETAILED DESCRIPTION

Figure 1:
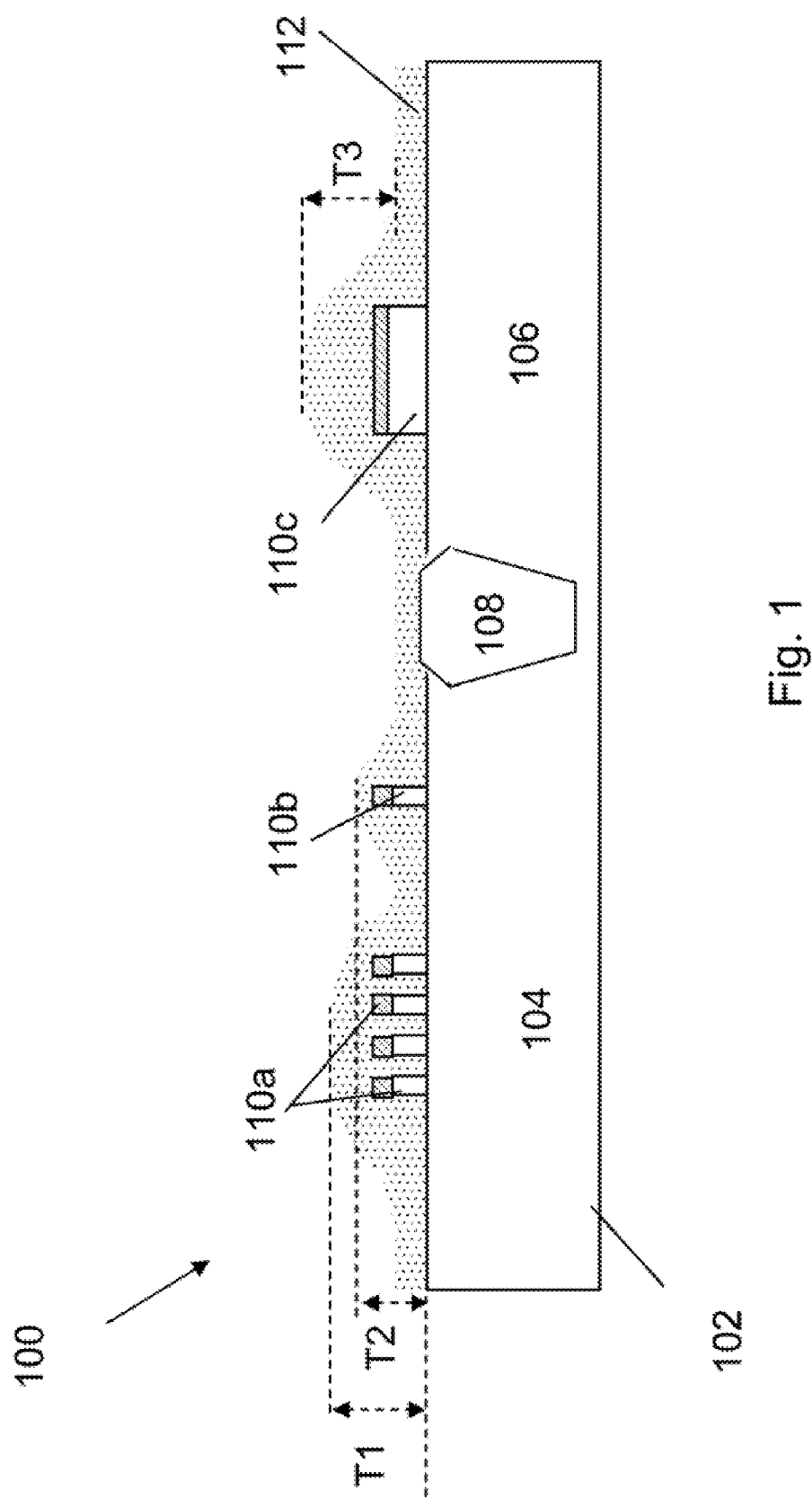
FIG. 1 is a cross-sectional view illustrating an embodiment of a non-uniform coating on a substrate.

The present disclosure relates generally to semiconductor processing. It is understood, however, that the following disclosure provides many different embodiments, or examples, for implementing different features of the invention. Specific examples of components and arrangements are described below to simplify the present disclosure. These are, of course, merely examples and are not intended to be limiting. Though described herein as an apparatus and/or method for fabricating semiconductor devices on a semiconductor substrate, various other embodiments are possible. For example, in fabrication of photomasks, TFT LCDs, and/or other technologies. In addition, the present disclosure may repeat reference numerals and/or letters in various examples. This repetition is for the purposes of simplicity and clarity and does not itself dictate a relationship between the various embodiments or configurations discussed. Furthermore, descriptions of a first layer "on," "overlying," and like descriptions, a second layer includes embodiments where the first and second layers are in direct contact as well as those where one or more layers interpose the first and second layer.

Referring to FIG. 1, illustrated is a cross-sectional view of a device 100 during a stage of fabrication. The device 100 includes a semiconductor substrate 102 including a first section 104 and a second section 106. An isolation feature 108 interposes the first section 104 and the second section 106. The isolation feature 108 may be a shallow trench isolation (STI) feature. In section 104, a plurality of features 110a and 110b are disposed on the substrate. Section 104 illustrates an isolated-dense bias (e.g., T1-T2). For example, features 110a are disposed in a dense arrangement (e.g., pattern density) while feature 110b is an isolated feature. The topography of section 104 provides for a non-uniform thickness of coating 112. The coating 112 has a first thickness T1 overlying the dense arrangement (e.g., increased pattern density) of features 110a. The coating 112 his a second thickness T2 overlying the isolated feature 110b. T1 is greater than T2. The difference in T2 and T1 may be described as an iso-dense bias. Similarly, the topography of the second section 106 of the substrate 102 also affects the thickness of the coating 112. The feature 110c provides a step height T3 of the coating 112.

In an embodiment, the coating 112 is a photoresist layer. The non-uniform coating of the coating 112 may cause issued with further processing of the semiconductor device 100. For example, during an etch back process of the coating 112, because of the non-uniform thickness of the coating 112, portions of the substrate 102 (including features formed thereon) may be damaged. Further, residual amounts of the coating 112 may remain on the substrate 102 in areas intended to be removed (e.g., unmasked). For example, in an etch back process of the coating 112, the isolation feature 108 may be damaged by the etch process as a thinner coating 112 overlies the isolation feature 108. In contrast, as a thicker coating 112 (e.g., T1) overlies the features 110a and/or the features 110c, an etch back process may leave residual coating 112 overlying one or more of these features. This may be disadvantageous if the features 110a and/or 110c were intended to be exposed (unmasked) for further processing (e.g., for a hard mask layer removal from the features 110a/110c). Examples of other defects that may occur from an etch back process of the non-uniform coating 112 include peeling of dummy features, for example, dummy poly features.

Therefore, the device 100 may be disadvantageous due to the non-uniform coating 112 applied over the varied topography substrate 102. The varied topography includes varying pattern density and step heights, which create iso-dense bias and step height differences of the coating 112. One or more of these disadvantages may be improved by one or more embodiments of the methods and devices described herein.

Figure 2:
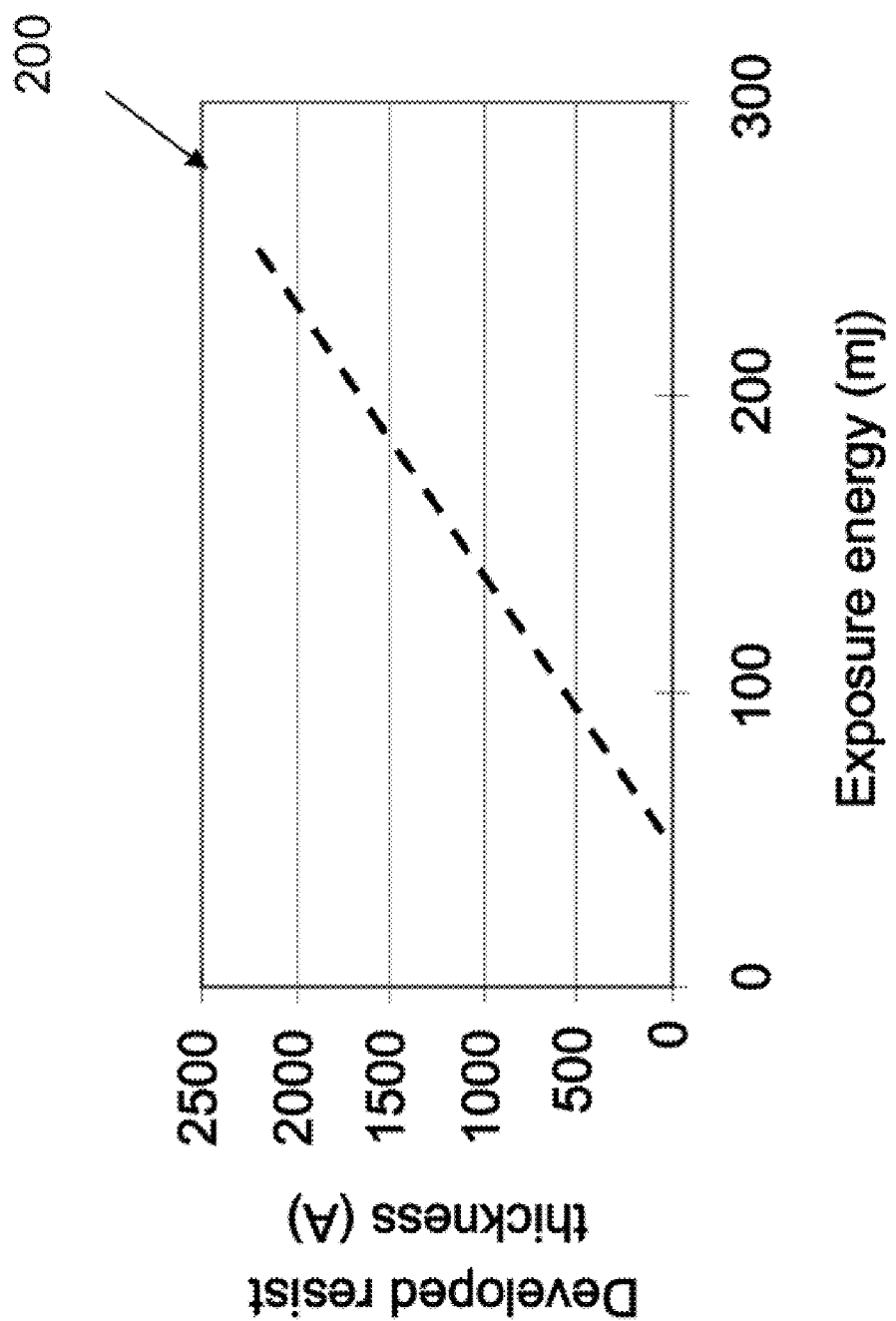
FIG. 2 is a graph illustrating an experimental embodiment of exposure energy versus a thickness of photoresist that is developed by the energy.

Referring now to FIG. 2, illustrated is a graph 200 which illustrates an embodiment of a relationship between exposure energy and the thickness of developed photosensitive material. The graph 200 illustrates that greater the exposure energy (e.g., the greater the energy/intensity of a radiation beam incident a target surface of photosensitive material), the greater the thickness of photosensitive material that is developed. The energy of a radiation beam is also described herein as an intensity. Intensity may be expressed as a percentage of radiation; the percentage being relative to the radiation from the source, the radiation incident on the photomask, and/or relative to the radiation traversing another area of the photomask.

As described above, the graph illustrates that different thicknesses of photosensitive material may be developed by using different intensity of radiation. An intensity selective exposure includes an exposure to a radiation beam that has varied energies or intensities at different locations on the target. Therefore, an intensity selective exposure may allow for different thickness of photosensitive material to be developed at different positions on a target substrate. The intensity selective exposure may be applied to a non-uniform coating of photosensitive material (e.g., coating 112 described above with reference to FIG. 1) to selectively reduce the thickness of the coating by developing greater amounts of photoresist at specific regions. The intensity selective exposure is described in further detail below.

Referring now to FIGS. 3a and 3b, illustrated is an embodiment of a photomask 300. A photomask may also be referred to as a "mask" or "reticle". The photomask 300 is referred to herein as a gradated photomask. The gradated photomask 300 may provide an intensity selective exposure of a substrate. The gradated photomask 300 includes regions providing for different intensities of radiation to traverse the photomask 300, as described below. The gradated photomask 300 may be used in the method 600 described below with reference to FIG. 6.

The photomask 300 includes a substrate 302. The substrate 302 may include a transparent substrate such as fused silica ($SiO_2$). A plurality of features are disposed on (or in) the substrate 302. In an embodiment, the photomask 300 is a binary intensity mask (BIM or binary mask). The binary intensity mask may include features of chrome and areas of transparent substrate, such as fused $SiO_2$. In other embodiments, the photomask 300 may be another mask technology known in the art such as, an alternating phase shift mask (AltPSM), and attenuating phase shift mask (AttPSM), chromeless phase shift pattern mask, and/or other suitable types. Other examples of attenuating material include Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_2R$, or a combination thereof.

The gradated photomask 300 may include a pattern associated with a main feature or features to be formed (e.g., imaged) on the substrate (e.g., the photomask may include patterns that are imaged on a target substrate to provide features of a semiconductor device or portions thereof, for example, defining a pattern for a gate, source, drain, interconnect, via, and the like). In another embodiment, the graduated photomask 300 may include no main features that are to be imaged onto the substrate. An advantage of this embodiment may be that a semiconductor manufacturer can fabricate and control the photomask 300 independently from a circuit designer. For example, a foundry can independently control the mask from a fabless semiconductor company. Though no main feature may be provided in the photomask 300, the photomask 300 may be associated with a specific integrated circuit or circuits and/or included in a mask set where other masks in the set are used to define the main features.

The gradated photomask 300 includes a first exposure region 304, a second exposure region 306, a third exposure region 308, and a fourth exposure region 310. The regions 304, 306, and 308 each include a plurality of features 312. In an embodiment, the features 312 include chrome. In an embodiment, the features 312 are sub-resolution features such that they will not be imaged directly onto the target substrate (e.g., nonprinting features). The features 312 may be substantially similar in size to sub-resolution assist features (SRAFs) or scattering bars used in lithography processes, however, have no main or primary feature with which they are associated (e.g., a feature which they assist in patterning on a target substrate). The shape, arrangement, quantity of the features 312 are exemplary only and not intended to be limiting in any manner. The features 312 may be provided in any shape, configuration, layout, or other parameter, provided they are sub-resolution features.

In use, the photomask 300 is placed in a photolithography apparatus between a radiation source and a target substrate. The radiation source provides radiation beams directed to the target substrate, which passes through the photomask. The radiation source may be any suitable light source such as an ultra-violet (UV), or deep ultra-violet (DUV) source. More specifically, the radiation source may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

The target substrate may be a semiconductor wafer having silicon, germanium, diamond, or a-compound semiconductor. The substrate may alternatively include other materials such as glass for thin-film transistor liquid crystal display (TFT_LCD) devices or fused silicon/calcium fluoride for photomask. The target substrate may include a plurality of layers formed thereon, each having patterned structures. The target substrate may be coated with a photosensitive imaging layer such as photoresist for lithography patterning process. An exemplary photoresist material includes chemical amplified photoresist (CAR). A target substrate is described in further detail below with reference to FIG. 4.

The gradated photomask 300 provides an intensity selective exposure in that different intensities of the radiation traverse the photomask in different regions. Therefore, different intensities or energies of radiation are incident a target substrate at different regions or sections. The gradated photomask 300 varies the energy of the radiation traversing it by varying the density of sub-resolution features 312. For example, an increased density of sub-resolution features 312 in a region will block more of the radiation incident on the photomask 300 in that region, thereby providing a decreased exposure intensity (e.g., energy level) of radiation to be incident the target substrate at its corresponding region.

A greater intensity (e.g., higher energy) of radiation traverses the photomask 300 in region 310 than the intensity traversing in region 304. A greater intensity of radiation traverses the photomask 300 in region 304 than in region 306. A greater intensity of radiation traverses the photomask 300 in region 306 than in region 308. In an exemplary embodiment, the first region 304 provides an exposure intensity of 55%; the second region 306 provides an exposure intensity of 42%; the third region 308 provides an exposure intensity of 25%; and the fourth region 310 provides an exposure intensity of 100%. These are by way of example and not intended to be limiting. The exposure intensity includes the percentage of the energy of the radiation beam that traverse the region of the photomask 300.

The photomask 300 also includes regions 314 where radiation does not traverse, and therefore the target substrate at that location is exposed to zero or substantially zero radiation. In an embodiment the regions 314 include chrome features. It is noted that FIGS. 3a and 3b may not include all features specifically illustrated.

The design of the gradated photomask 300 (e.g., the location and selective intensity provided by each region of the mask) may be determined based on the integrated circuit design with which it is associated. The design may be based on layout of a layer or layers of an integrated circuit device to be formed. The layout of the IC may include the density and height of the main features of the IC. For example, the design of the photomask 300 may be based on the layout of the preceding photomask(s) of the mask set or the underlying layer or layers of the device. The integrated circuit design used to determine the design of the photomask 300 may be defined in design files, layout files, mask data, and/or other suitable materials. The design of the graduated photomask 300 may be generated using experimental data and/or models.

A gradated photomask may be associated with a specific integrated circuit design as it is based upon the layout of one or more layers of the design. One or more graduated photomasks may be included in the mask set used to fabricate a given integrated circuit.

Figure 4:
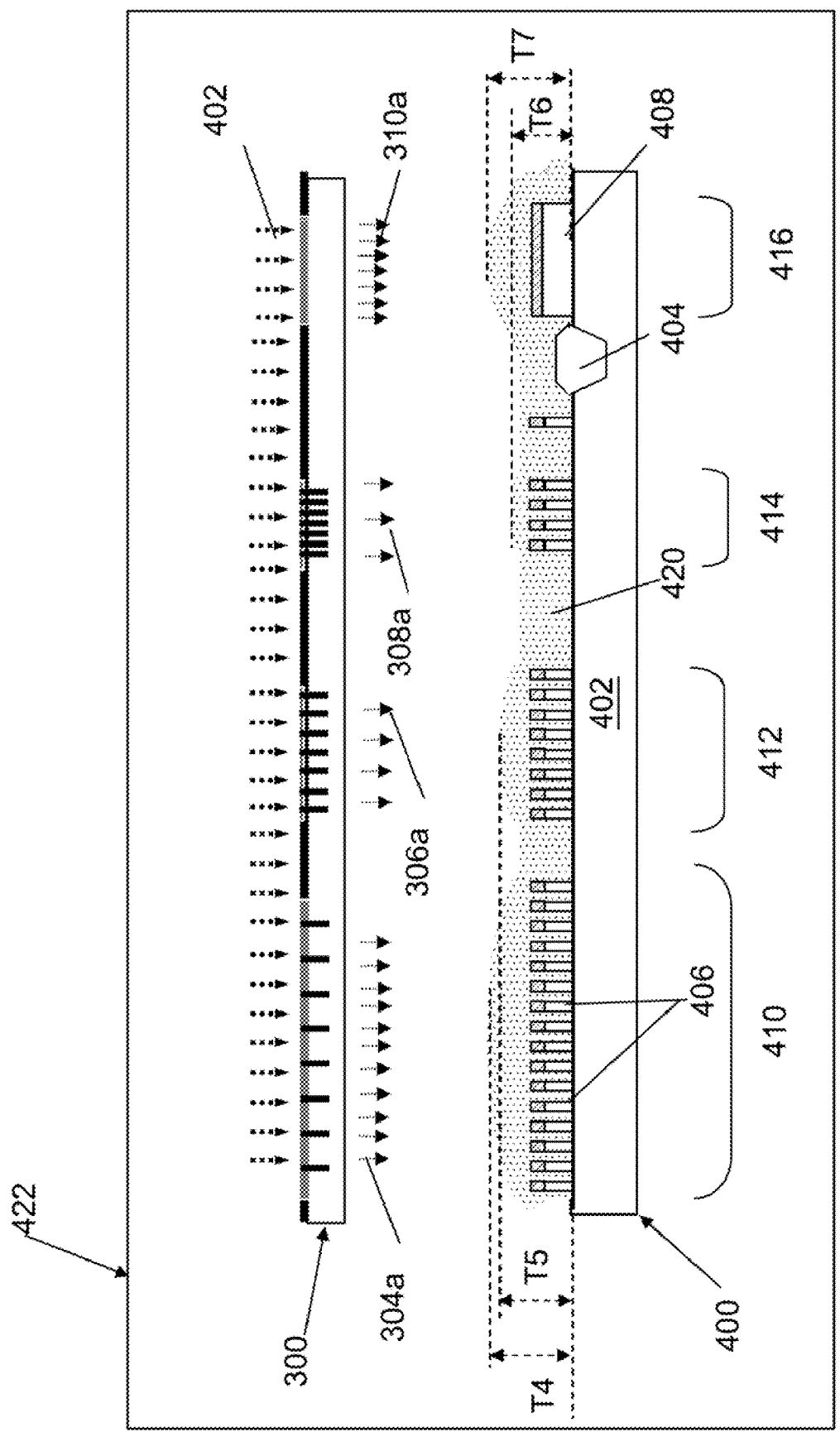
FIG. 4 is a cross-sectional view illustrating an embodiment of a photomask and corresponding target substrate.

Referring now to FIG. 4, illustrated is the photomask 300 and an associated target substrate 400 in a lithography apparatus 422. The photomask 300 may be substantially similar to as described above with reference to FIGS. 3a and 3b. Radiation 402 is incident on the photomask 300. The radiation 402 may be any suitable radiation (light) source such as an ultra-violet (UV), or deep ultra-violet (DUV) source. More specifically, the radiation source may be, a mercury lamp having a wavelength of 365 nm (I-line); a Krypton Fluoride (KrF) excimer laser with wavelength of 248 nm; or an Argon Fluoride (ArF) excimer laser with a wavelength of 193 nm.

As described above with reference to FIGS. 3a and 3b, the photomask 300 is a gradated photomask including regions providing various intensities (e.g., energies) of radiation that traverse the photomask 300. Radiation 304a is provided by region 304 of the photomask 300; radiation 306a is provided by region 306 of the photomask 300; radiation 308a is provided by region 308 of the photomask 300; radiation 310a is provided by region 310 of the photomask 300. In an embodiment, radiation 304a, 306a, 308a, and 310a may each be a different intensity (e.g., energy level (mj)). For example, radiation 310a may be greater than 304a, which is greater in energy than 306a, which is greater in energy than 308a. In an embodiment, radiation 310a includes approximately 100% of the energy the radiation 402. In an embodiment, radiation 304a, 306a, and/or 308a may be between approximately 20% and 80% of the radiation 402.

The photomask 300 is associated with the target substrate 400 in that the photomask 300 is aligned with and used to expose portions of the target 400. Specifically, the photomask 300 is used for intensity selective exposure of the target 400, as described below. The target 400 includes a semiconductor substrate (e.g., wafer) 402. The semiconductor substrate 402 may be substantially similar to the substrate 102 described above. An isolation feature 404 is disposed on the substrate 102. In an embodiment, the isolation feature 404 is omitted. The isolation feature 404 may be a shallow trench isolation (STI) feature or other isolation feature known in the art. A plurality of features 406 and 408 are disposed on the substrate 402. The features 406 and 408 may be gate features (e.g., of a p-type or n-type field effect transition (FET)), dummy features, interconnect lines, and/or other possible features. In an embodiment, the features 406 are gate features including a gate electrode (e.g., polysilicon) and a sacrificial layer of hard mask formed on the gate electrode. The target 400 has a varied topography including a different density, quantity, and/or size of features 406 and 408.

A photosensitive layer 420 is formed on the substrate 402 overlying the features 406 and 408. The photosensitive layer 420 may be a photoresist, for example, a chemical amplification resist (CAR). Similar to as described above with reference to FIG. 1, the photosensitive layer 420 has a non-uniform thickness. For example, in region 410 of the substrate 400, the photosensitive layer 420 has a height T4; in region 412 the photosensitive layer 420 has a height T5; in region 414, the photosensitive layer 420 has a height T6; and in region 416 the photosensitive layer 420 has a height T7. In an embodiment, T7>T4>T5>T6.

Region 310 of the photomask 300 is associated with (e.g., is aligned with and provides for) exposure of region 416 of the target substrate 400; region 304 is associated with exposure of region 410; region 306 is associated with exposure of region 412; region 308 is associated with exposure of region 414. Therefore, the regions of the photomask 300 providing exposure with greater relative intensity of radiation are aligned with those regions of the target substrate 400 having a greater relative thickness of the photosensitive layer 420.

Figure 5:
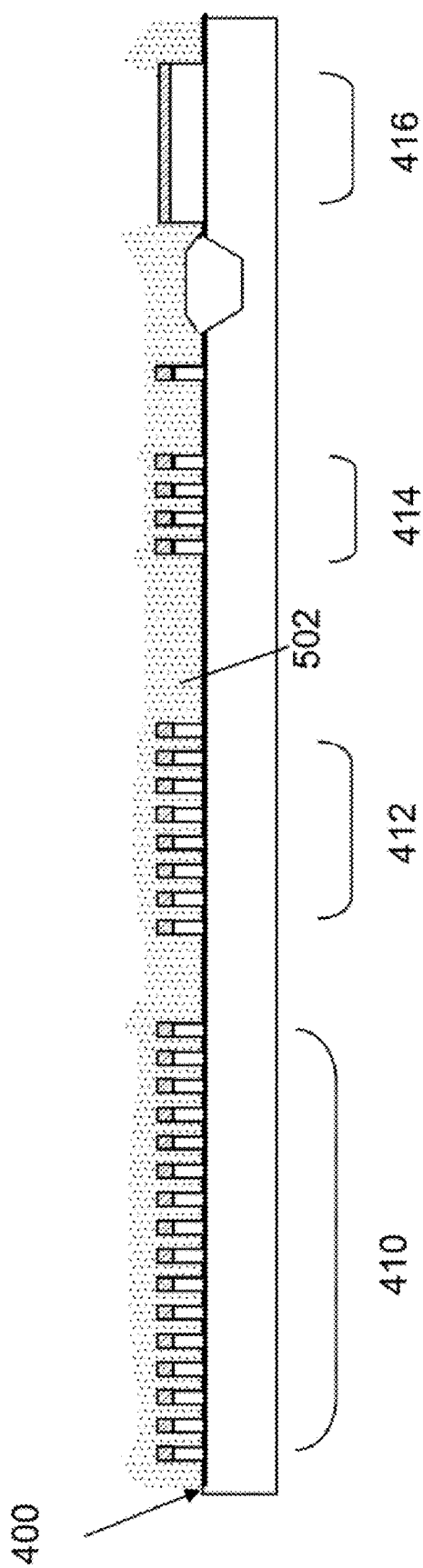

Referring now to FIG. 5, illustrated is an embodiment of the target 400 after exposure with the gradated mask 300, as illustrated in FIG. 4. Further processing may also be performed such as post-exposure bake (PEB), development process, rinse process, dry (e.g., spin dry) process, bake processes, and/or other suitable processes. The development process may include use of a developer such as tetra-methyl ammonium hydroxide (TMAH). Portions of the photosensitive layer, illustrated as layer 420 in FIG. 4, have been removed to provide photosensitive layer 502. The photosensitive layer 502 may be substantially planar and/or have improved planarity over photosensitive layer 420. For example, a greater amount of material has been removed from the photosensitive layer overlying region 410 than the amount of material removed from the photosensitive layer overlying region 414.

Figure 6:
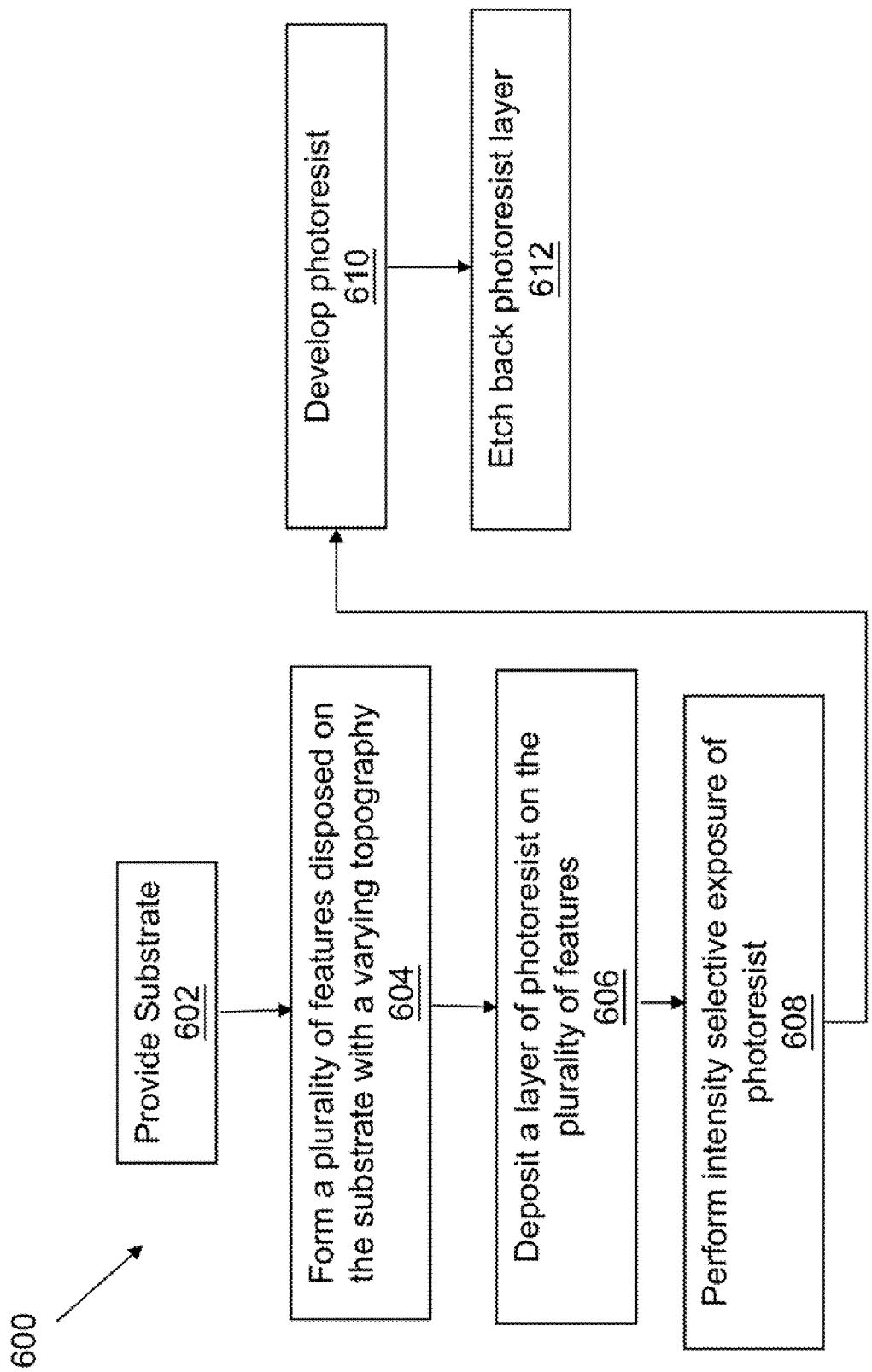
FIG. 6 is a flow chart illustrating an embodiment of a method of semiconductor fabrication including intensity selective exposure.

Referring now to FIG. 6, illustrated is a method 600 for fabricating semiconductor devices. The method 600 begins at step 602 where a substrate is provided. The substrate (e.g., semiconductor wafer) may be substantially similar to the substrate 102 and/or 402 described above with reference to FIGS. 1 and 4 respectively. The method 600 then proceeds to step 604 where a plurality of features are formed on the substrate providing a varied topography. A varied topography may include areas of dense features, isolated features, different size or shape features, different height features, and/or other topography differences. The features may include gate features, interconnect lines, plugs, dummy features, isolation features, and/or other typical features of semiconductor devices such as transistors. The features may be formed using processes known in the art such as, photolithography, etching, deposition, implantation, and/or other suitable semiconductor processes.

The method 600 then proceeds to step 606 where a layer of photosensitive material (e.g., photoresist) is formed on the substrate overlying the features having a varied topography. The layer of photoresist may be substantially similar to the photoresist 112 and/or 420, described above with reference to FIGS. 1 and 4 respectively. The photoresist deposited over the varied topography may be non-planar and includes areas of greater and/or lesser relative thickness. In an embodiment, the photoresist is deposited using a spin-on process.

The method 600 then proceeds to step 608 where an intensity selective exposure process is performed. The intensity selective exposure process includes providing radiation incident a target substrate that has varying intensities (e.g., energy) across the substrate. The intensity selective exposure process may utilize a gradated mask such as, the photomask 300 described above with reference to FIGS. 3a, 3b, and 4. The gradated mask includes regions allowing different relative intensities of radiation to traverse the mask as defined by densities of sub-resolution features. The intensities may range between 0-100% of that of the radiation incident on the mask. By way of example, the intensity selective exposure may be performed such that a greater intensity (energy) radiation is incident the substrate in portions of the substrate having a thicker photoresist layer and, likewise, a lesser intensity (energy) radiation is incident the substrate in portions of the substrate having a relative thinner photoresist layer.

The method 600 then proceeds to step 610 where the exposed photoresist is developed. Additional processing may also be included such as, post-exposure bake (PEB) processes. The amount of material soluble in the developer and/or removed from the substrate by the developer is dependent upon the energy level provided in the exposure process described above with reference to step 608. The development process may include providing TMAH to the substrate, for example, by a puddling process. In an embodiment, the developer removes a greater amount (thickness) of photoresist at regions where the photoresist layer is relatively thicker, for example, as described above with reference to FIG. 5. Thus, after step 610 the planarity of the photoresist layer may be improved.

The method 600 may continue with additional bake processes, rinse processes, dry processes, and/or other suitable processes. The method 600 then proceeds to step 612 where the photoresist layer is etched back. The etch back process may include a wet etch and/or dry etch process. In an embodiment, the etch back process may expose portions of the underlying features such as the features described above with reference to step 606. In an embodiment, a layer of hard mask, or portion thereof, is removed from the features after etch back of the photoresist. The hard mask, for example, may be disposed on a gate feature of an NFET or PFET device. In an embodiment, step 612 is omitted.

Therefore, provided are embodiments of gradated photomasks and embodiments of intensity selective exposure of a target substrate. One or more of the embodiments of the gradated photomask and/or intensity selective exposure process may allow for increasing the planarity of a layer on the substrate. A layer may suffer from non-uniformity as it overlies a varying topography. One or more embodiments described herein provide for removing portions of material from a non-planar photosensitive material layer to improve its planarity.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A method, comprising:
providing a semiconductor substrate;
depositing a photosensitive material on the semiconductor substrate, wherein the depositing includes forming a first thickness of photosensitive material at a first section of the substrate and a second thickness of photosensitive material at a second section of the substrate, wherein the first thickness is greater than the second thickness by a first amount;
providing a photomask having a first region and a second region, wherein the first and second regions each include a plurality of sub-resolution features;
exposing the photosensitive material, wherein the exposing includes passing radiation through the photomask, wherein radiation passing through the first region of the photomask is incident the first section of the substrate and radiation passing through the second region of the photomask is incident the second section of the substrate; and
developing the exposed photosensitive material, wherein the developing provides a layer having a third thickness of photosensitive material in the first section of the substrate and a fourth thickness of photosensitive material in the second section of the substrate, the third thickness being greater than the fourth thickness by a second amount, the second amount being less than the first amount.

2. The method of claim 1, wherein the radiation passing through the first region of the photomask is of a greater energy than the radiation passing through the second region of the photomask.

3. The method of claim 1, wherein the radiation incident on the first section of the substrate is different in intensity that the radiation incident on the second section of the substrate.

4. The method of claim 1, further comprising:
determining a variation in thickness of a photosensitive layer disposed on a semiconductor substrate, wherein the determining includes determining the first thickness and the second thickness.

5. The method of claim 4, wherein the determining the variation includes determining a pattern density of a plurality of features underlying the photosensitive layer.

6. The method of claim 1, wherein the exposing the photosensitive material does not expose a pattern associated with a device feature on the photosensitive layer.

7. The method of claim 1, wherein the radiation passing through the first region of the photomask and the radiation passing through the second region of the photomask have an intensity between approximately 20% and 80% of the radiation incident the photomask.

8. A method, comprising:
providing a semiconductor substrate;
forming a plurality of features on the semiconductor substrate, wherein the plurality of features provide a first substrate region having a first topography and a second substrate region having a second topography;
depositing a photosensitive layer on the substrate overlying the plurality of features wherein the photosensitive layer has a difference in thickness between the first substrate region and the second substrate region; and
performing an intensity selective exposure of the photosensitive layer on the first and second substrate region, wherein the intensity selective exposure includes:
providing a radiation beam;
passing the radiation beam through a first region of a photomask and a second region of the photomask, wherein the first region allows a first energy level of the radiation beam to traverse the photomask and the second region allows a second energy level of the radiation beam to traverse the photomask, wherein the first and second energy level of radiation are different; and
exposing the photosensitive layer including exposing the photosensitive layer overlying the first substrate region to the first energy level of radiation, and exposing the photosensitive layer overlying the second substrate region to the second energy level; and
developing the photosensitive layer such that a first amount of material is removed from the photosensitive layer overlying the first substrate region and a second amount of material is removed from the photosensitive layer overlying the second substrate region, wherein the removing the first amount of material and the second amount of material from the photosensitive layer decreases the difference in thickness between the photosensitive layer on the first substrate region and the second substrate region.

9. The method of claim 8, wherein the first energy level and the second energy level are less than 100% of the energy of the radiation beam from a radiation source.

10. A method comprising:
providing a semiconductor substrate;
forming a plurality of features on the semiconductor substrate;
forming a photosensitive layer over the plurality of features on the semiconductor substrate, wherein the photosensitive layer as formed has at least two different thicknesses;
exposing the photosensitive layer utilizing a gradated photomask wherein the gradated photomask includes a first region including a first plurality of sub-resolution features, wherein the first region blocks a first percentage of the incident radiation; and a second region including a second plurality of sub-resolution features, wherein the second region blocks a second percentage of the incident radiation, and wherein the first and second percentage are different; and
developing the photosensitive layer, wherein the developing provides a photosensitive layer having an increased planarity.

11. The method of claim 10, wherein the first and second region do not include a feature to imaged onto a target substrate.

12. The method of claim 10, wherein the first and second percentage are between approximately 20% and approximately 80%.

13. The method of claim 10, wherein the first and second plurality of sub-resolution features are configured in arrays having different pattern densities.

14. The method of claim 10, wherein gradated photomask further includes a third region including a third plurality of sub-resolution features, wherein the third region blocks a third percentage of the incident radiation, and wherein the first, second, and third percentage are different.

15. The method of claim 10, wherein the gradated photomask does not include a pattern defining an integrated circuit feature.

16. The method of claim 10, wherein forming the plurality of features also utilizes a second photomask, wherein the second photomask includes:
a first area defining a first plurality of features having a first density, and
a second area defining at least one feature having a second density, wherein the first area of the second photomask and the first region of the gradated photomask are configured to expose a first section of a target, and wherein the second area of the second photomask and the second region of the gradated photomask expose a second section of a target.

17. The method of claim 16, wherein the first plurality of features and the at least one feature are gate features of a semiconductor device.

18. The method of claim 10, wherein the first and second plurality of sub-resolution features include chrome.

* * * * *